(12) United States Patent
Thakur et al.

(10) Patent No.: US 7,617,468 B2
(45) Date of Patent: Nov. 10, 2009

(54) METHOD FOR AUTOMATIC MAXIMIZATION OF COVERAGE IN CONSTRAINED STIMULUS DRIVEN SIMULATION

(75) Inventors: Shashidhar Anil Thakur, Santa Clara, CA (US); Rahul Hari Dani, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 143 days.

(21) Appl. No.: 11/831,673

(22) Filed: Jul. 31, 2007

(65) Prior Publication Data

US 2009/0037858 A1   Feb. 5, 2009

(51) Int. Cl.
*G06F 17/50* (2006.01)
*G06F 11/00* (2006.01)
*G06F 9/45* (2006.01)
*G01R 31/28* (2006.01)

(52) U.S. Cl. .............................. 716/5; 703/14; 714/738
(58) Field of Classification Search ....................... None
See application file for complete search history.

(56) References Cited

U.S. PATENT DOCUMENTS

| | | | |
|---|---|---|---|
| 6,141,630 A | 10/2000 | McNamara et al. | |
| 6,499,127 B1 | 12/2002 | Kim et al. | |
| 6,684,359 B2 | 1/2004 | Noy | |
| 6,816,825 B1 | 11/2004 | Ashar et al. | |
| 6,925,617 B2 | 8/2005 | Bayraktaroglu et al. | |
| 6,975,976 B1 * | 12/2005 | Casavant et al. | 703/14 |
| 7,107,553 B2 | 9/2006 | Lockyear et al. | |
| 7,114,111 B2 * | 9/2006 | Noy | 714/738 |
| 7,243,087 B2 | 7/2007 | Iyer | |
| 7,478,028 B2 * | 1/2009 | Ho et al. | 703/14 |
| 2004/0249618 A1 | 12/2004 | Fine et al. | |
| 2006/0010428 A1 * | 1/2006 | Rushby et al. | 717/124 |
| 2006/0048026 A1 | 3/2006 | Fine et al. | |

OTHER PUBLICATIONS

U.S. Appl. No. 11/831,745, filed Jul. 31, 2007, Shashidhar Anil Thakur.
Lachish, O. et al. "Hole Analysis for Functional Coverage Data", Design Automation Conference (DAC), Jun. 10-14, 2002, pp. 6.

(Continued)

*Primary Examiner*—Leigh Marie Garbowski
(74) *Attorney, Agent, or Firm*—Silicon Valley Patent Group LLP; Omkar Suryadevara

(57) ABSTRACT

A computer increases coverage in simulation of a design of a circuit by processing goals for coverage differently depending on whether or not the goals are on input signals of the circuit. Specifically, goals on input signals are used to automatically formulate constraints ("directly-derived constraints") on values of input signals in test vectors. Goals on non-input signals (e.g. internal/output signals) are used with correlations to automatically formulate more additional constraints ("correlation-derived constraints"), by use of goals on non-input signals. The correlations indicate which non-input signals are associated with which input signals. The correlations are received from, for example, a human designer of the circuit. Depending on the embodiment, one or more of the automatically derived constraints are used with human-supplied constraints, to generate test vectors e.g. using a constraints solver, such as a satisfiability (SAT) engine. The test vectors are supplied to a simulator for functional verification.

19 Claims, 6 Drawing Sheets

OTHER PUBLICATIONS

Fine, S. et al. "Coverage Directed Test Generation for Functional Verification using Bayesian Networks", Design Automation Conference (DAC), 2003, pp. 6.

Wagner, I. et al. "StressTest: An Automatic Approach to Test Generation Via Activity Monitors", Design Automation Conference (DAC), Jun. 13-17, 2003, pp. 6.

Rosenberg, S. et al. "Coverage-Driven Functional Verification", Sep. 2001, http://www.verisity.com/resources/whitepaper/coverage_driven.html, pp. 7.

Mishra, P. et al. "Functional Coverage Driven Test Generation for Validation of Pipelined Processors", Mar. 12, 2004, CECS Technical Report #04-05, Center of Embedded Computer Systems, University of California, Irvine, California, pp. 19.

"Constrained-Random Test Generation and Functional Coverage with Vera®", Feb. 2003, Synopsys, Inc., pp. 8.

Iyer, M. A. et al. "Race: A World-Level ATPG-Based Constraints Solver System For Smart Random Simulation", 2003, IEEE, pp. 10.

Hekmatpour, A. et al "Coverage-Directed Management and Optimization of Random Functional Verification", 2003, IEEE, pp. 8.

Liu, C. et al. "CAMA: A Multi-Valued Satisfiability Solver", University of California at Berkeley, CA, USA, believed to be prior to Jul. 31, 2007, pp. 8.

Damiano, R. et al. "Checking Satisfiability of a Conjunction of BDDs", DAC, 2003, pp. 6.

Ganai, M. K. et al. "Combining Strengths of Circuit-based and CNF-based Algorithms for a High-Performance SAT Solver", Jun. 10-14, 2002, DAC, New Orleans, Louisiana, USA, pp. 14.

Piziali, A. Chapter 7 in a book "Functional Verification Coverage Measurement And Analysis", 2004, Kluwer Academic Publishers, pp. 11.

Grinwald, R. et al. "User Defined Coverage—A Tool Supported Methodology for Design Verification" $35^{th}$ Design Automation Conference, 1998, San Francisco, CA, USA, pp. 6.

Pixley, C. et al. "SoCKit", believed to be prior to Jul. 31, 2007, pp. 3.

"SystemVerilog 3.1a Language Reference Manual Accellera's Extensions to Verilog®", http://www.eda.org/sv/SystemVerilog_3.1a.pdf, 2004, pp. 586.

* cited by examiner

FIG. 1A
(prior art)
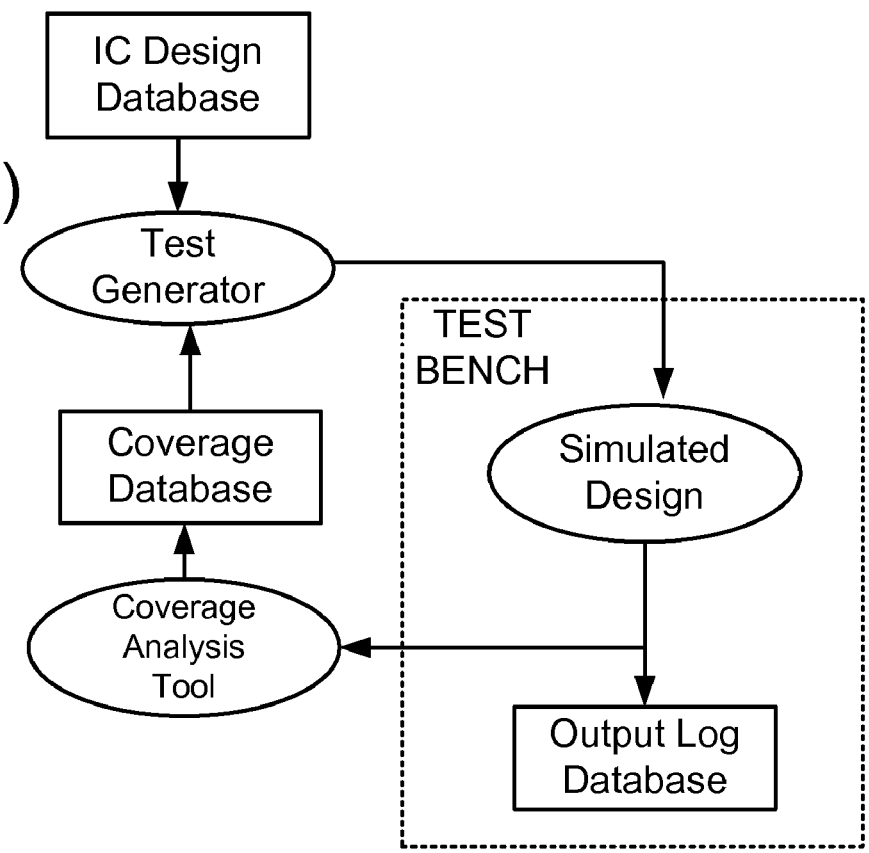
FIG. 1B
(prior art)
| Name | Description |
|---|---|
| Arith-SNaN | Instr $\in$ Arith $\Rightarrow$ Result $\neq$ SNaN |
| NonArith-Round | Instr $\notin$ Arith $\Rightarrow$ Round Occur = 0 |
| Abs-Nabs | Instr = fabs $\Rightarrow$ Result $\notin$ Negative AND Instr = fnabs $\Rightarrow$ Result $\notin$ Positive |
FIG. 1C
(prior art)
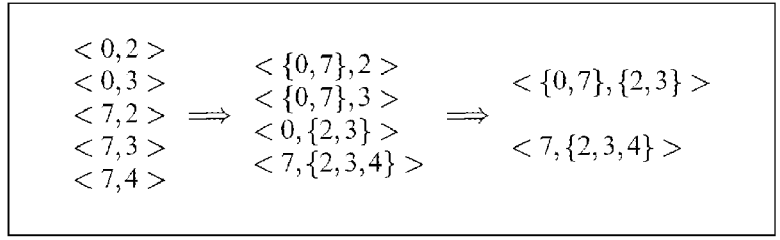

METHOD FOR AUTOMATIC MAXIMIZATION OF COVERAGE IN CONSTRAINED STIMULUS DRIVEN SIMULATION

CROSS REFERENCE TO RELATED APPLICATION

This application is related to and incorporates by reference herein in its entirety US patent application 11/831,745 entitled "METHOD FOR AUTOMATICALLY EXTRACTING A FUNCTIONAL COVERAGE MODEL FROM A CONSTRAINT SPECIFICATION" that is commonly owned and filed on Jul. 31, 2007.

BACKGROUND

1. Field of the Invention

The invention relates to design of tests that are used in simulation of design(s) of circuits. More specifically, the invention relates to a method and an apparatus for automatically increasing functional coverage in stimulus driven simulation of the circuit designs that are typically implemented in integrated circuit (IC) chips.

2. Related Art

In the design of integrated circuit (IC) chips, it is common to test IC designs by use of a testbench. A test bench in a high-level verification language (HVL) environment includes test generators that randomly generate input signals for the IC design. U.S. Pat. No. 6,141,630 granted to McNamara, et al. on Oct. 31, 2000 entitled "System and method for automated design verification" is incorporated by reference herein in its entirety as background. This patent describes a coverage analysis tool (see FIG. 1A attached hereto) which monitors output data from a simulated design and identifies portions of the simulated design that remain to be tested. The coverage analysis tool updates a coverage database. A test generator is coupled to the IC design database and the coverage database. The test generator produces and sends test vectors to the test bench which exercise (i.e., test) the portions of the simulated design that the coverage analysis tool has indicated still remain untested. The simulated design includes software, expressed in Verilog or VHDL which is executed within a computer to model the operational characteristics of the circuit being designed.

Values of test vectors may be generated randomly in the belief that events of interest to the user will eventually occur as simulation progresses over time. However, there is no guarantee that such events will in fact occur during a limited duration within which simulation is performed, or that such events will occur even if the simulation duration is infinitely long. Some prior art testbenches generate test vectors (each vector containing a set of values of stimulus signals) independent of (i.e. without reference to) the events of interest specified by the user. If any user-specified events do not occur during simulation, the user laboriously creates additional values for the stimulus signals (either manually or by specifying additional directives to test generators) to attempt to achieve coverage of any events that have not yet occurred (also called "holes").

An article entitled "Hole Analysis for Functional Coverage Data" by Oded Lachish, et al. presented at the Design Automation Conference (DAC) Jun. 10-14, 2002 is incorporated by reference herein in its entirety as background. This article describes as a first step, a need for the user to model restrictions. As examples of user-supplied restrictions, this article shows (see FIG. 1B attached hereto) combinations of attribute values that should never occur. Next, after coverage of tests has been measured, this article describes performance of a method called "hole analysis" for discovering and reporting large uncovered spaces for cross-product functional coverage models. In a cross-product functional coverage model, the list of coverage tasks comprises all possible combinations of values for a given set of attributes. According to this article, hole analysis groups together sets of uncovered tasks that share some common properties, thus allowing the coverage tool to provide shorter and more meaningful coverage reports to the user. As an example, this article states that it is much more informative to report that a "reject" response never occurred, than it is to include all possible cases of a request with a "reject" response in the list of uncovered tasks.

This article by Oded Lachish, et al. further teaches aggregating together any two holes whose Hamming distance is one. Thus, two uncovered tasks <0,2> and <0,3> are aggregated into a single hole <0,{2,3}>. The article notes that Hamming distances can be also computed on aggregated holes and that the distance between any two holes is equal to the number of differing attributes, but now the comparison is done for aggregated sets as well as atomic values. The article states that the process can be applied iteratively until no more new aggregated holes are discovered. FIG. 1C (attached hereto) shows how the five tasks <0,2>, <0,3>, <7,2>, <7,3>, and <7,4> can be aggregated together until only the holes <{0,7}, {2,3}> and <7, {2,3,4}> remain.

The above-described article by Oded Lachish, et al. further describes one objective of hole analysis as finding projected holes of highest dimensionality. The article defines dimensionality as follows "Any coverage model of n attributes can be viewed as a set of tasks or points in an n-dimensional space." The article further describes iterating over all potential holes, starting with those of the highest dimensionality, whereby any subspace that is unmarked is reported as a significant hole and its descendants are recursively marked. Finally, this article also states that the language used by their coverage tools to report holes is equivalent to the one used by the user for defining restrictions. One example provided in this article is that a hole <Arith,SNaN,*,*> is expressed by the restriction Instr ∈ Arith ⇒Result≠SNaN. The article goes on to state: "This means that holes can be easily translated into restrictions if necessary. In many cases, the translation can be automated."

An article entitled "Coverage Directed Test Generation for Functional Verification using Bayesian Networks" by Shai Fine and Avi Ziv presented at the Design Automation Conference (DAC) 2003 is also incorporated by reference herein in its entirety as background. This article describes a first step in which a training set is used to learn the parameters of a Bayesian network that models a relationship between coverage information and directives to test generators. In a second step, the Bayesian network is used to provide the most probable directives that would lead to a given coverage task (or set of tasks). Another article entitled "StressTest: An Automatic Approach to Test Generation Via Activity Monitors" presented by Ilya Wagner, Valeria Bertacco and Todd Austin, presented at the Design Automation Conference (DAC) Jun. 13-17, 2005 is incorporated by reference herein in its entirety as background. This article describes a tool called StressTest for automatically generating instructions to test a microprocessor design.

See also, yet another article entitled "Coverage-Driven Functional Verification" by Sharon Rosenberg and David Van Campenhout published in September 2001, available at following URL (wherein "/" is replaced by "%"):

http:%%www.verisity.com%resources%whitepaper%
coverage_driven.html.

Also see the article entitled "Functional Coverage Driven Test Generation for Validation of Pipelined Processors" by Prabhat Mishra and Nikil Dutt, published Mar. 12, 2004 as CECS Technical Report #04-05, by Center for Embedded Computer Systems, University of California, Irvine, Calif. Both these articles are also incorporated by reference herein in their entirety as background.

Constraints on signals to be input to an IC design's simulation, as well as goals for coverage of such signals ("coverage goals") during functional verification of the IC design may be manually specified in a hardware verification language (HVL) called "SYSTEMVERILOG" which is described in, for example, a document entitled "SystemVerilog 3.1a Language Reference Manual Accellera's Extensions to Verilog®" available at http:%%www.eda.org%sv%SystemVerilog_3.1a.pdf (wherein "/" is replaced by "%"), and this document is incorporated by reference herein in its entirety as background. An alternative HVL language is called OpenVera and is used by the VERA tool available from Synopsys, Inc. For more information on OpenVERA, see the book entitled "The Art of Verification with VERA" published September 2001 by Faisal Haque, Jonathan Michelson, and Khizar Khan that is incorporated by reference herein in its entirety. This book is available for purchase at http:%%www.verificationcentral.com%. Use of OpenVERA is also described in U.S. Pat. No. 6,925,617 that is incorporated by reference herein in its entirety, as background.

SUMMARY

A computer is programmed with software ("coverage maximizer") in accordance with the invention to increase functional coverage in simulation of a design of a circuit by using coverage goals to automatically create one or more constraints on values of input signals in test vectors. Specifically, the computer is programmed to supply the just-described constraints ("coverage-based constraints") in addition to one or more additional constraints that are manually specified ("manually-specified constraints") to a constraints solver which generates test vectors for the circuit design's simulation. The test vectors are stored in a computer memory, and later used in a simulator in the normal manner.

In some embodiments, the computer includes a coverage analyzer that uses test results to identify coverage goals that have not been met, i.e. unmet coverage goals. In these embodiments, the computer is further programmed to use the unmet coverage goals to prioritize coverage-based constraints that correspond to the unmet coverage goals at a higher priority for use in generating test vectors. Moreover, in some embodiments, coverage goals on non-input signals (e.g. goals on internal signals and/or output signals of the circuit) are also used with additional information from a human, hereinafter "correlations", to automatically create and/or identify another type of coverage-based constraints ("non-input goal constraints"). A correlation indicates to the computer that a human-specified non-input signal tends to vary with one or more human-specified input signal(s). Use of the two different types of coverage-based constraints to generate test vectors provides flexibility in improving functional coverage to a level not obtained by use of any prior art known to inventors.

BRIEF DESCRIPTION OF THE FIGURES

FIG. 1A illustrates a prior art system for automated design verification which includes a test generator, a simulated design and a coverage analysis tool.

FIG. 1B illustrates prior art examples of combinations of attribute values that should never occur.

FIG. 1C illustrates a two step process of the prior art by which five tasks are aggregated so that only holes <{0,7}, {2,3}> and <7, {2,3,4}> remain.

DETAILED DESCRIPTION

A computer 200 (FIG. 2) is programmed with software ("compiler") to read text files which specify constraints on input signals of an integrated circuit (IC) design in a constraints specification file, and coverage goals for the input signals in a coverage specification file. The two files are typically held in a non-volatile memory 212 of computer 200, and both files are normally expressed in a Hardware Verification Language (HVL), such as OpenVera or System Verilog.

Hence, compiler 211 (FIG. 2) that is included in computer 200 can be any OpenVera compiler of the type available from Synopsys, Inc. of Mountain View, Calif., or alternatively any System Verilog compiler that may be available in the industry, such as Questa compiler available from Mentor Graphics.

Note that a compiler of the type commonly available in the industry is customized in various embodiments to maintain specific associations inside computer 200 between constrained signals and covered signals as described herein, in order to convert unmet goals into constraints. Specifically, the compiler is programmed to preserve such association(s) by writing notations in the generated code, of the type that will be apparent to the skilled artisan in view of the following description. The output generated by such a compiler, including any notation written therein to preserve associations, may be used by any software that uses the output, such as a constraint solver and/or coverage analyzer, as discussed below.

Each of the just-described two specifications in store 212 may be written by a human using any text editor, in conformance with an appropriate Hardware Verification Language (HVL). In several illustrative embodiments, both the constraints specification and the coverage specification in store 212 are prepared manually, by a person knowledgeable about the IC design that is being tested. However, in certain embodiments, either of these two specifications may be prepared automatically from the other of these two specifications by appropriate programming of computer 200. Specifically, a constraints specification (that may have been manually specified originally) is used in some embodiments to automatically generate coverage goals in a coverage specification, as discussed in greater detail in U.S. patent application Ser. No. 11/831,745 that has been incorporated by reference, as noted above at the beginning of this specification (in the cross-reference section above).

Figure 2:
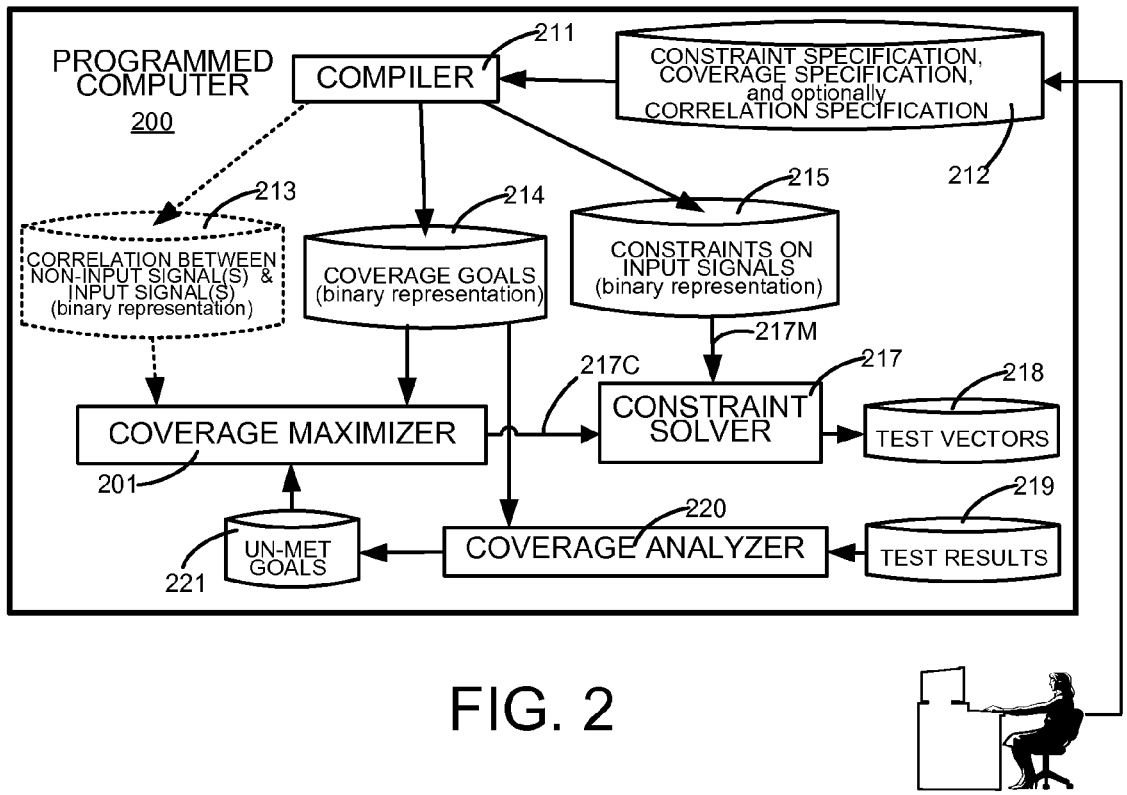
FIG. 2 illustrates, in a high level block diagram, a computer that has been programmed in accordance with the invention with software ("coverage maximizer") to use coverage goals to automatically create constraints on values of input signals in test vectors.

Referring to FIG. 2, compiler 211 in computer 200 includes a lexical analyzer and a parser that together transform a textual representation of constraints from a file in non-volatile memory 212 into a binary representation (e.g. in the form of a binary tree) which is stored in memory 215 of computer 200. Similarly, a binary representation of coverage goals identified in a coverage specification in non-volatile memory 212 is prepared by compiler 211 and stored in another memory 214 of computer 200. Note that in translating the constraints specification and the coverage specification, compiler 211 operates in a manner similar or identical to any prior art compiler for HVL, such as a compiler for OpenVera or SYSTEM VERILOG.

A coverage specification in non-volatile memory 212 (such as a disk) is manually specified by the user, typically in a hardware verification language, on input signals as well as on non-input signals such as internal signals and output signals. The user normally has access to a part of the circuit design (in simulation) or to the testbench tool where the non-input signals are accessible, and the user has some intuition (based on knowledge of functionality of the design and/or testbench) as to which non-input signals are of interest and uses this knowledge to write a coverage specification which includes coverage goals for non-input signals.

Computer 200 (FIG. 2) is further programmed with software ("coverage maximizer") 201 in accordance with the invention to supply (via path 217C) one or more coverage-based constraints to a constraints solver 217 that also receives manually-specified constraints (via path 217M). Initially, coverage maximizer 201 generates one or more coverage-based constraints based on coverage goals from memory 214. Constraints solver 217 uses the coverage-based constraint(s) from path 217C in combination with one or more additional constraints from coverage maximizer 201 (via path 217M), to generate one or more test vector(s) 218. Test vectors 218 are generated by constraint solver 217, at random in some embodiments while constrained by several constraints, for use in generating input signals that are to be applied to an IC design, for testing and functional verification during simulation of the IC design.

The inventor of the current patent application believes that use of the combination of the two types of constraints, namely coverage-based constraints (via path 217C) and manually-specified constraints (via path 217M) together causes constraints solver 217 to generate one or more test vectors that are not otherwise generated by prior art methods which use only one type of constraints (e.g. prior art using only manually-specified constraints). Therefore the current inventor believes that functional coverage is increased by use of a combination of two types of constraints, as described in the previous paragraph.

Furthermore, note that several embodiments of computer 200 increase functional coverage in testing an IC design, by implementing a feedback loop which uses information obtained from testing of the IC design as follows. A coverage analyzer 220 in computer 200 uses results 219 (of one or tests being performed on the IC design) and coverage goals in memory 214 to identify one or more coverage goals that have not yet been met, i.e. unmet coverage goals 221. In these embodiments, coverage maximizer 201 uses unmet coverage goals 221 to prioritize corresponding coverage-based constraints for use by constraints solver 217 in generating test vectors 218. Specifically, each unmet coverage goal on one or more input signal(s) is used by coverage maximizer 201 to automatically create and/or identify a type of coverage-based constraints ("input goal constraints") on the same one or more input signal(s).

The inventor of the current patent application further believes that use of a feedback loop with the above-described combination of two types of constraints causes constraints solver 217 to generate one or more test vectors that are not generated by prior art methods that do not use feedback in combination. Therefore functional coverage is believed to be increased by use of feedback in combination as described in the previous paragraph.

Additionally, certain embodiments of computer 200 implement the above-described feedback loop more specifically as follows. Coverage maximizer 201 is programmed to use unmet coverage goals on non-input signals (e.g. internal signals and/or output signals of the circuit) that are manually specified, with additional information in the form of correlations from memory 213, to automatically create and/or identify another type of coverage-based constraints ("non-input goal constraints"). In such embodiments, correlations in memory 213 are binary representations of associations between input signals and non-input signals that are specified in a file of correlations stored in non-volatile memory 212.

Specifically, a correlation in accordance with the invention is an indication to computer 200 that a specified non-input signal tends to vary with one or more specified input signal(s). Accordingly, correlations indicate which non-input signals are associated with which input signals, without necessarily identifying a specific relationship therebetween. For example, if an output signal X is a result of multiplying input signals Y and Z, then a correlation merely identifies that X tends to vary with (Y, Z) without identifying the multiplication operation. Such correlations can be received by computer 200 in any manner, for example, from a human designer of the circuit and/or automatically inferred from analysis of a specification of functional design of the circuit.

The inventor of the current patent application believes that use of such correlations in the above-described feedback combination causes constraints solver 217 to generate one or more test vectors that are not generated by prior art methods that do not use correlations. Therefore functional coverage is believed to be increased by use of correlations in a feedback combination, as described in the previous paragraph.

Figure 3A:
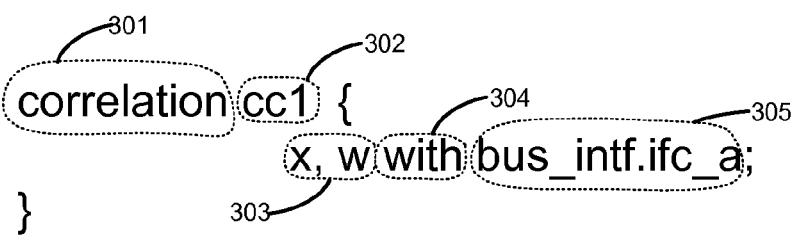
FIG. 3A illustrates a correlation that is used in some embodiments by the computer of FIG. 2 to proxy a coverage goal on a non-input signal (such as an output signal or an internal signal), with one or more coverage goals on input signals by specifying constraints on the input signals.

Depending on the embodiment, a correlation may be specified by a human using a text editor, in a text file in a predetermined format of the type illustrated in FIG. 3A. Note that this format is merely an illustration, and as will be apparent to the skilled artisan in view of this disclosure other text or non-text formats may be used to express correlations in other embodiments. In the illustrated text format shown in FIG. 3A, a reserved word 301 "correlation" is used to identify to a compiler the start of a correlation. Note that a compiler for correlations can be same as compiler 211 described above if appropriately changed to translate correlations as described herein.

Referring to FIG. 3A, the reserved word (i.e. keyword) 301 is followed by a name 302 that has been given to the correlation, and such a name can have any value depending on the human's choice. The correlation's name 302 is followed by an open brace "{" which is followed by a comma-separated list 303. List 303 is provided by the human to identify the names of one or more input signals that are being correlated. List 303 is followed by the reserved word 304 of value "with" that in turn is followed by another comma-separated list 305. List 305 is also provided by the human to identify the names of one or more internal signals or output signals that are being correlated. In the example shown in FIG. 3A, list 305 is followed by a semicolon, that in turn is followed by a closing brace "}" which signals the end of the correlation.

Note that list 303, reserved word 304, list 305 and the semicolon together constitute a statement, and a human may specify any number of such statements (although only one statement is illustrated in FIG. 3A) all of which together form a single correlation identified by the name 302. Furthermore, any number of such correlations may be provided in a correlation specification in non-volatile memory 212.

In some embodiments, the above-described compiler 211 in computer 200 is extended to translate correlations expressed in human-readable text in a correlation specification file into binary form as follows. Accordingly, in such embodiments the HVL language (such as OpenVera or SYSTEMVERILOG) is extended to support correlations. Specifically, after parsing a correlation as described above in reference to FIG. 3A, two lists VARLIST1 and VARLIST2 are initialized with corresponding values in the two lists 305 and 303. Note that VARLIST1 contains non-input signals and VARLIST2 contains input signals. In addition, in act 360, VARLIST2 is copied to VARLISTSAVED.

Figure 3B:
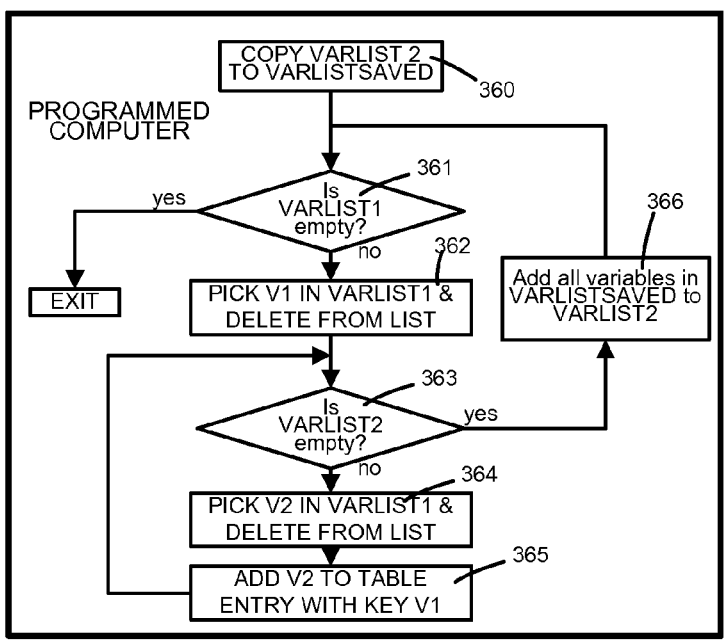
FIG. 3B illustrates, in a flow chart, acts performed in some embodiments to prepare binary representation of correlations between non-input signals (such as output signals and internal signals) and input signals, which are specified manually as illustrated in FIG. 3A.

As illustrated by act 361 (FIG. 3B), computer 200 checks if VARLIST1 is empty, and if so a translation operation is now complete for this correlation and computer 200 takes the left branch shown in FIG. 3B to exit this procedure. If VARLIST1 is not empty, computer 200 goes to act 362 and initializes a signal V1 with a signal from VARLIST1 and deletes this signal from VARLIST1. Then computer 200 goes to act 363 to check if VARLIST2 is empty and if so the computer copies VARLISTSAVED to VARLIST2 in act 366 and returns to act 361.

In act 363, if VARLIST2 is not empty, computer 200 goes to act 364 and initializes a signal V2 with a signal from VARLIST2 and deletes this signal from VARLIST2. Then computer 200 goes to act 365 and adds V2 to an entry in a table, which entry uses V1 as a key. Next computer 200 returns to act 363 (described above). Accordingly, on exiting this procedure, a table is populated with one entry for each signal in VARLIST1. Each entry for a signal Vi identifies one or more signals Vj in VARLIST 2 that are known to vary with the signal Vi.

Figure 5A:
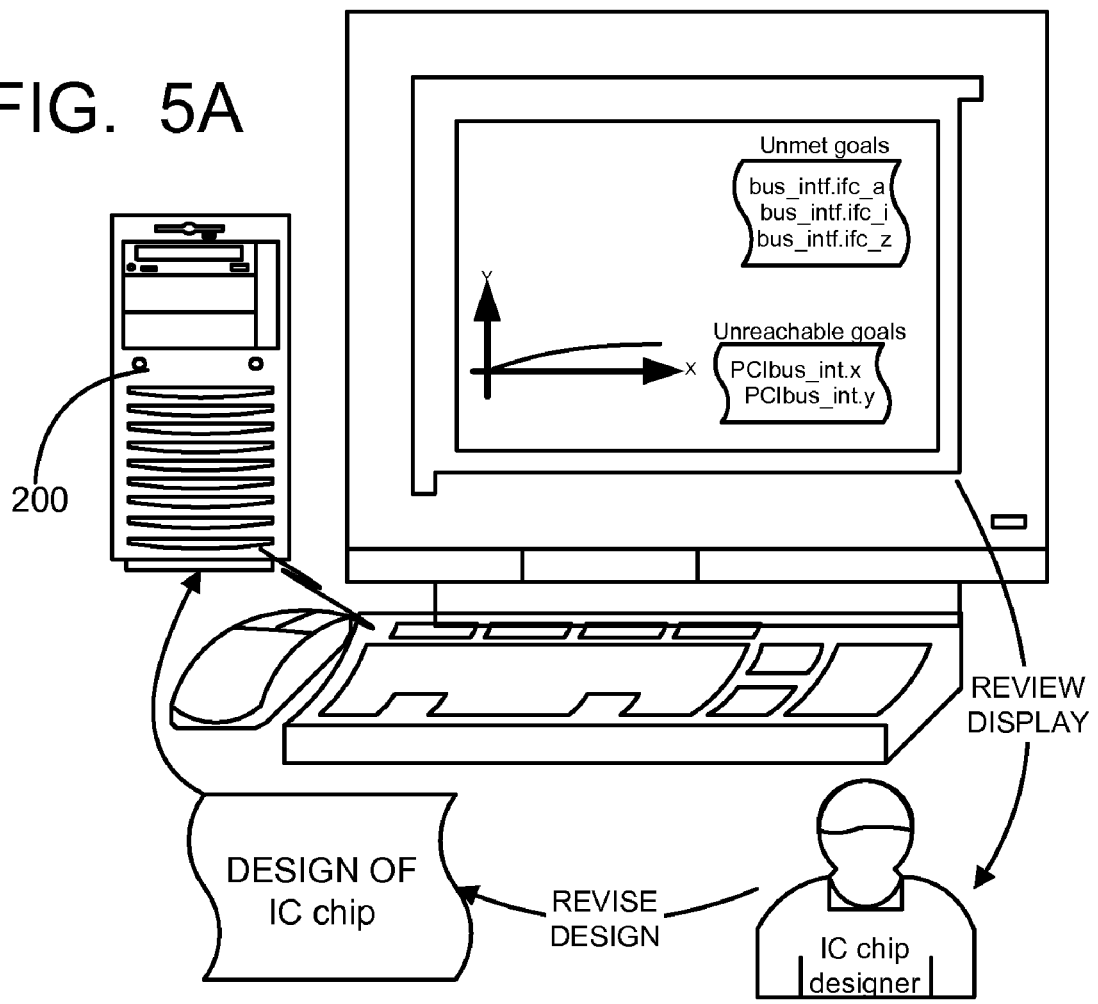
FIG. 5A illustrates, in a block diagram, a computer that is programmed in accordance with the invention.

In some embodiments, computer 200 is packaged with software called "test bench" 400 that includes three components of the type described above, namely coverage maximizer 201, coverage analyzer 220 and constraint solver 217. Depending on the embodiment, compiler 211 may or may not be included within the software package that constitutes test bench 400. During normal operation, test bench 400 also includes coverage-based constraints 401 that are automatically generated by coverage maximizer 201. Coverage-based constraints 401 are stored in a binary form in a memory that is internal to test bench 400. In certain embodiments, binary-form constraints 401 are rendered into human-readable form (e.g. as text) and displayed on a monitor of computer 200 (see FIG. 5A). Test bench 400 of several embodiments also includes a transactor 402 that receives test vectors 218 and uses them to generate appropriate signals (in the form of transactions) to be applied by simulator 404 to an IC design expressed in HDL (such as Verilog or VHDL) that is being simulated for functional verification.

Transactor 402 is operated in the normal manner to generate transactions which are specific to the IC design in simulation, as described in a transaction specification 403. Transaction specification 403 can be generated in any manner well known in the art, and is not a critical aspect of the current invention. Transactor 402 also monitors one or more signals of the IC design in simulation in response to the transaction(s), and supplies test results to coverage analyzer 220. The specific design and operation of transactor 402 is also not a critical aspect of the current invention, although an example is described next for illustration.

If the IC design in simulation is a packet processor, transactor 402 is directed by transaction specification 403 to operate appropriately to interface with the packet processor. In this example, if a test vector 218 specifies that a particular input signal is to have a particular value, then transactor 402 uses this information to prepare an appropriate packet to be supplied to simulator 404, and supplies the packet at an appropriate time, e.g. by waiting for normal operation, if the packet processor is dropping packets due to overload.

Moreover, the specific design and operation of simulator 404 is also not a critical aspect, and the HDL simulator which is used depends on the embodiment. Additionally, the specific design and operation of constraints solver 217 is also not a critical aspect of the invention, e.g. a satisfiability (SAT) engine can be used as a constraint solver. One illustrative embodiment uses a constraints solver of the type described in U.S. Pat. No. 7,107,553 by Lockyear, et al. that is incorporated by reference herein in its entirety. Furthermore, some embodiments of test bench 400 also include a debugger 405, the design and operation of which is also not critical to practicing the invention. In some embodiments, a software package that includes test bench 400 does not include simulator 404, e.g. as in case of the VERA product available from Synopsys, Inc. although in other embodiments a single software package may include both test bench 400 as well as simulator 404, as in the case of the VCS product also available from Synopsys, Inc.

Figure 4A:
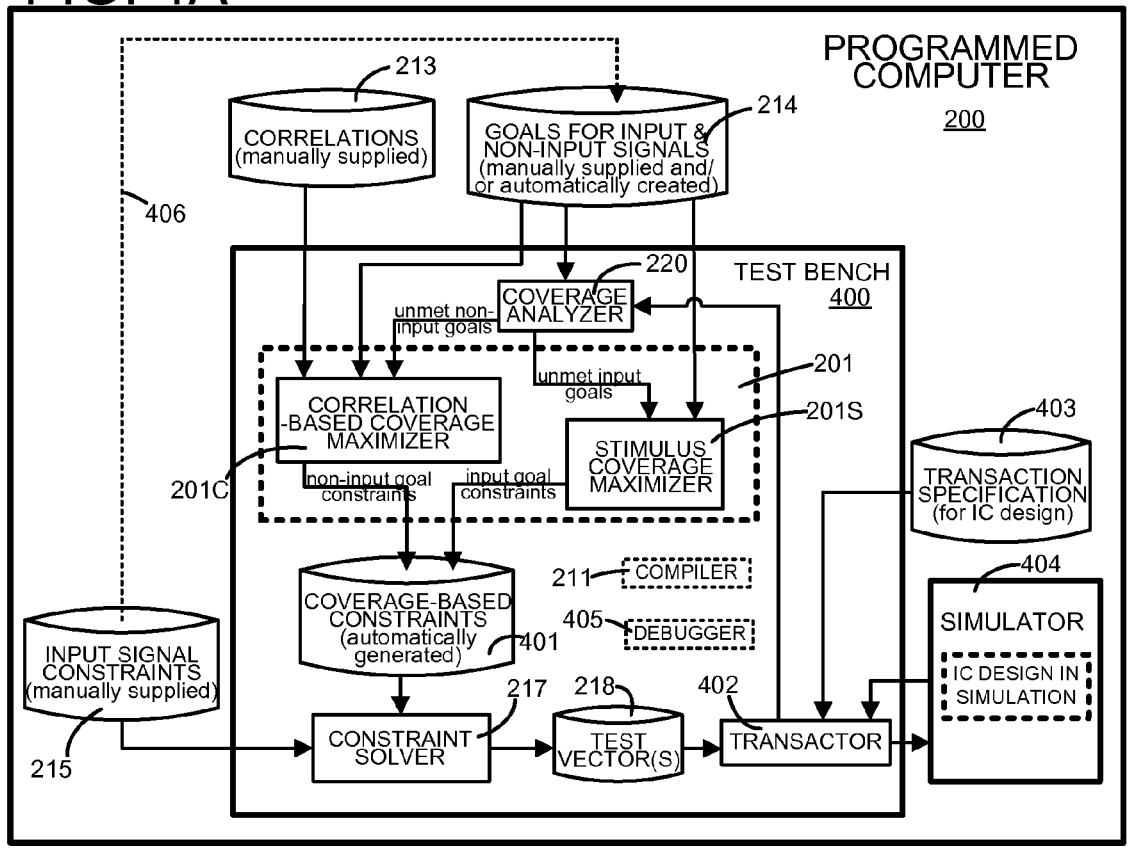
FIG. 4A illustrates, in an intermediate level block diagram, various components that are present in some embodiments of the programmed computer of FIG. 2, such as a transactor, and a coverage maximizer that itself includes two sub-components, namely a stimulus coverage maximizer and a correlation-based coverage maximizer.

Referring to FIG. 4A, coverage maximizer 201 of some embodiments is implemented in two software portions that are customized to process unmet coverage goals differently, depending on whether or not coverage goals are on input signals (also called "stimulus signals") of the circuit. Specifically, if the unmet coverage goals identified by coverage analyzer 220 are on input signals, these unmet coverage goals are processed by a software portion ("stimulus coverage maximizer") 201S which automatically formulates one type of coverage-based constraints ("input-goal constraints"). Alternatively if the unmet coverage goals identified by coverage analyzer 220 are on non-input signals (e.g. internal signals or output signals), these unmet coverage goals are processed by another software portion ("correlation-based coverage maximizer") 201C which uses manually-specified correlations (see FIG. 3A) to automatically formulate another type of coverage-based constraints ("non-input goal constraints").

Either of the two types of coverage-based constraints 401 may be used with constraints in memory 215 that are human supplied (e.g. by a designer of the circuit) in constraint solver 217, to generate test vectors 218. The constraints typically impose limits on random values that can be assigned to signals that are to be input to the circuit during simulation of the circuit design. Computer 200 may be programmed in some embodiments to display on its monitor (FIG. 5A) one or more unmet coverage goals and/or coverage goals that are unreachable and/or a graph of a coverage metric (also called "coverage score") as a function of a loop count which identifies the number of iterations performed so far. A human may review such a display to revise the IC design, if appropriate.

Furthermore, as noted above, manually-supplied constraints in memory 215 which are specified on input signals are used in some embodiments to automatically generate coverage goals 214 for coverage of input signals, as illustrated by the dotted arrow 406 in FIG. 4A and discussed in greater detail in reference to a coverage generator that is described and illustrated in U.S. patent application Ser. No. 11/831,745.

Figure 4B:
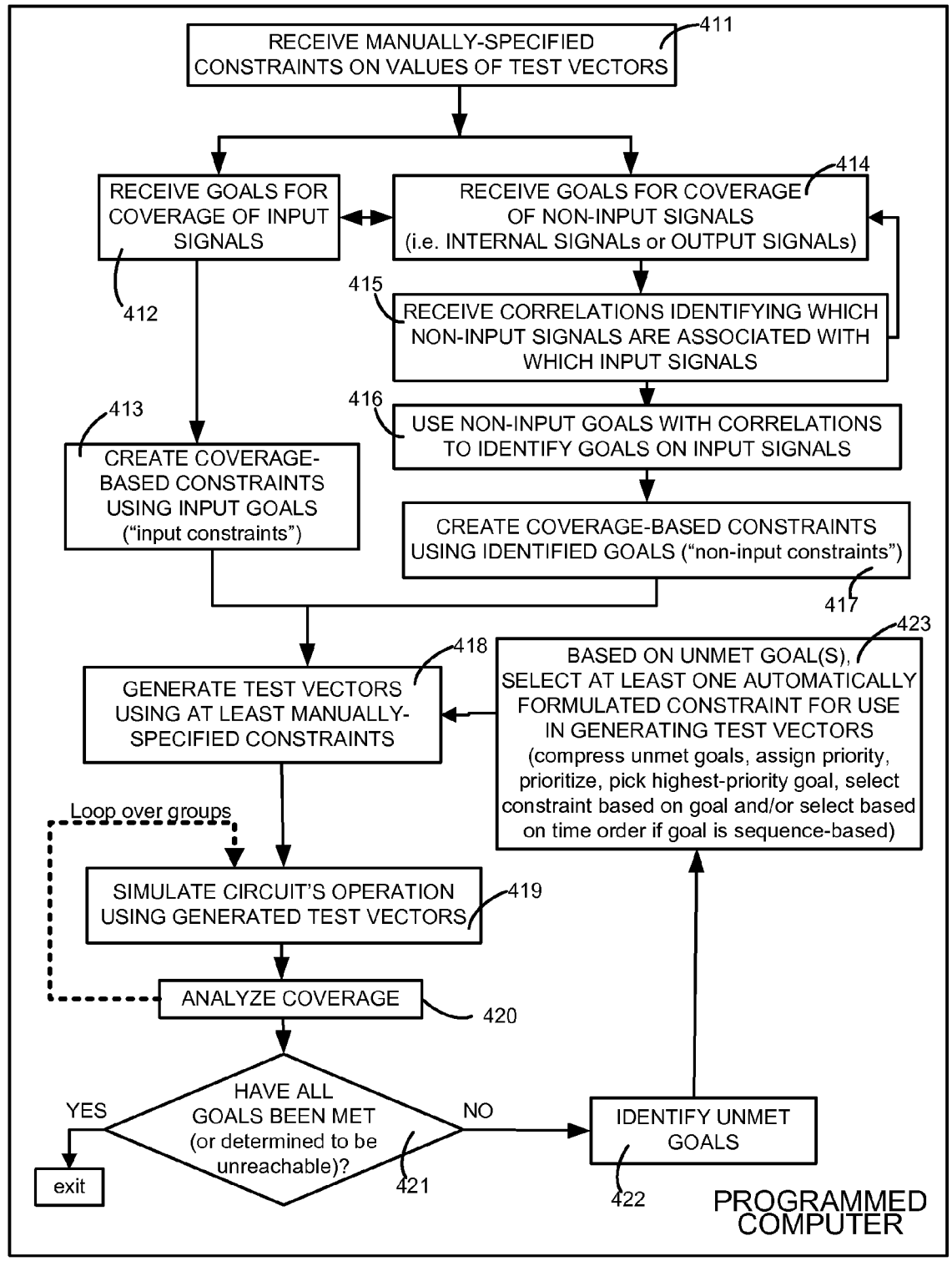
FIG. 4B illustrates, in a high level flow chart, acts performed by the programmed computer of FIG. 4A in some embodiments of the invention to use test results to generate test vectors that increase functional coverage in simulation of a design of an integrated circuit (IC).

In several embodiments, computer 200 is programmed with software to implement one or more loops as follows. The IC design is tested in simulation (by invoking simulator 404), unmet coverage goals 221 are identified (by invoking coverage analyzer 220), and unmet coverage goals 221 are in turn used (by invoking one of maximizers 201C and 201S) to identify one or more coverage-based constraints 401 that are then used (by invoking constraints solver 217) to generate test vectors for use in simulation. Implementation of such loops will be apparent to the skilled artisan in view of this disclosure, and the implementation of one embodiment is shown in FIG. 4B and described below as an illustration.

Specifically, in several embodiments of the invention, computer 200 receives manually-specified constraints on values of input signals to be used in test vectors, as per act 411. In one embodiment, the constraints are specified in conformance with Section 12 of "SystemVerilog 3.1a Language Reference Manual Accellera's Extensions to Verilog®", while in another embodiment the constraints are specified in Open-Vera. In some embodiments, after act 411, computer 200 invokes invoking stimulus coverage maximizer 201S to receive goals for coverage of the input signals, as shown by act 412. In one embodiment, the coverage goals are specified in conformance with Section 20 of "SystemVerilog 3.1a Language Reference Manual Accellera's Extensions to Verilog®", while in another embodiment the coverage goals are specified in OpenVera. Note that certain embodiments support both languages and either language may be used in a mix-match combination, for constraints and coverage goals.

Next, in act 413, maximizer 201S automatically creates coverage-based constraints using the input goals received in act 412. In doing so, in some embodiments, each input signal that can be assigned a random value is associated in computer 200 with a data structure that defines the goal as a cover point.

A cover point represents a signal (or variable) whose values are of interest and need to be monitored. Examples of cover points are described below in reference to Appendices A and B. A maximizer of the type described herein (such as either or both of 201S or 201C) can be programmed to respond to cover point goals (also called simply "cover points") of two or more types as follows. A first type of cover point goal is on fixed value(s), wherein a single counter is incremented when a signal identified in the goal has a given value or the signal has any value in a given range of values. A second type of coverage goal is on a sequence of values, wherein a single counter is incremented only when the signal attains each of the values of the sequence, and in a specified time order for the sequence.

The maximizer is programmed in several embodiments to automatically create constraint(s) for each of these two types of coverage goals, e.g. to create one constraint for a given value or three constraints for a given value range (one for each limit and one for a subrange exclusive of the limits) for the first type, and to create a number of constraints (one for each value in the sequence) for the second type. One illustrative embodiment of a coverage maximizer supplies to a constraint solver (in act 423), a number of constraints that are based on the values in such a sequence, in a time order that was specified for the values in the sequence. The time order is identified in computer 200 of the illustrative embodiment based on a unique number (constraint identifier) that is associated with each constraint, as discussed below. Note that the constraint identifier is assigned in the specified time order, by a compiler in computer 200 as noted below. In this embodiment, only after all values of the sequence are observed in a signal during simulation of the circuit design, and observed in the specified time order, then the single counter for the coverage goal is incremented.

In addition to supporting cover points, computer 200 of some embodiments also sets up additional data structures for additional goals called cross point goals. A cross point goal (or simply "cross point") is composed of cover points and is used when combinations of values of cover points are of interest and need to be monitored. Cover points and cross points both include bins (or counters) that identify whether or not certain values (i.e. targets) of signals have been reached, and if so how many times the targets have been reached (either alone—for cover points or in combination—for cross points). Accordingly, computer 200 is programmed to use such cover points and cross points in act 413 to automatically generate constraints ("coverage-based constraints"). The specific manner in which constraints are generated can differ, depending on the embodiment.

Computer 200 of some embodiments stores coverage-based constraints from act 413 in its local memory, grouped in a predetermined manner. The grouping that is performed may be different in different embodiments, although in some embodiments the constraints are grouped according to their relation to functional blocks within the IC design (e.g. all constraints on signals input to a first functional block are placed in a first group and so on). In certain embodiments, the grouping of signals is performed based on user input in either or both of a) constraint specification and b) coverage specification.

Instead of or in addition to acts 412 and 413, in some embodiments, computer 200 invokes correlation-based coverage maximizer 201C. Maximizer 201C receives goals for coverage of non-input signals, as shown by act 414, and also receives correlations identifying which non-input signals are associated with which input signals as per act 415. Note that in some embodiments, acts 412, 414 and 415 can be performed in any order relative to one another and may be performed any number of times. Maximizer 201C uses non-input goals with correlations to identify goals for input signals, as per act 416. Next, in act 417, maximizer 201C creates coverage-based constraints using the goals identified in act 416. At this stage as well, computer 200 may store coverage-based constraints from act 417 in its local memory, grouped in the predetermined manner described in the previous paragraph.

Accordingly, computer 200 enters a loop starting at act 418 after having received and converted into binary representation, several specifications such as a constraints specification (including values of input signals), a coverage specification (including goals on input and non-input signals), and a correlation specification (that associates input signals with non-input signals). Although not explicitly shown in FIG. 4B, at this stage computer 200 has also received one or more criteria to be used to terminate one or more loops that follow act 418. For example, computer 200 of some embodiments has received by this stage a number which acts as an upper limit on the number of iterations in any loop.

In certain embodiments, computer 200 initially enters the loop starting at act 418 with a complete set of manually-specified constraints (from the constraints specification) but none of the coverage-based constraints are used initially in act 418. Hence, initially in act 418, computer 200 invokes a constraints solver to generate test vectors using only the manually-specified constraints. Next, in act 419, computer 200 invokes a simulator to use the generated test vectors on the IC design in simulation.

Figure 4C:
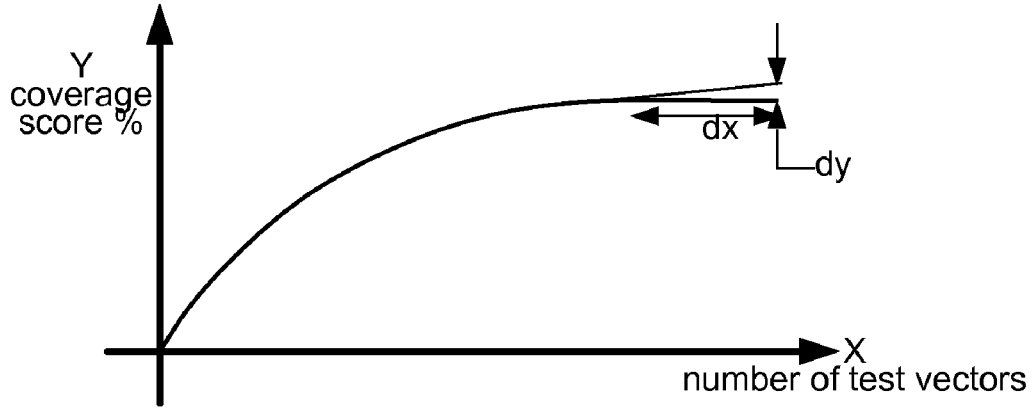
FIG. 4C illustrates, in a graph, change in coverage score as a function of the number of times stimulus is generated, whereby a slope of the curve is used in the embodiments of FIG. 4B to break out of an iterative loop on a group of coverage goals.

While simulation is in progress, computer 200 also analyzes functional coverage in act 420 to obtain a metric of coverage. The coverage metric is evaluated as per one or more predetermined condition(s) on looping, and until the condition is satisfied (or not satisfied depending on the embodiment) computer 200 allows the simulator to keep using the generated test vectors. In one example, when a curve of the coverage metric as a function of the number of test vectors becomes relatively flat (see FIG. 4C), computer 200 goes to act 421 (described below). In another example, when the coverage metric reaches its target, computer 200 goes to act 421.

In some embodiments that use groups, acts 419 and 420 are performed in a loop (called "inner loop") once for each group of several groups (i.e. when one group's coverage metric flattens, another group's test vectors are used and its coverage metric is evaluated, and so on, until all groups test vectors have been used and each group's coverage metric has flattened). Moreover, flatness of the coverage metric can be evaluated in act 420 in different ways, depending on the embodiment. Certain embodiments use a predetermined slope, such as 5% to decide that the coverage metric has flattened, although other embodiments receive as an input, a slope that is provided by a human. Still other embodiments use a different criterion, such as whether the loop's upper limit has been reached. Also, in some embodiments, in act 420, computer 200 also marks one or more unmet goals as being unreachable if the goal is contradicted by a manually-specified constraint. For example, if a human has specified that X is to have a value in the range [1,10] then any goal for X that is outside of this range is marked by computer 200 as being unreachable. The identification of unreachable goals is useful in terminating the loop as discussed next.

In act 421, computer 200 checks if all goals have been met or if the unmet goals have been shown to be unreachable, and if so computer 200 exits this loop (called "outer loop"), and performs one or more operations that are normally performed after completion of functional verification of the IC design. Examples of such operations are logic synthesis and layout of the IC design, followed by fabrication of the layout into a chip. Computer 200 also exits this loop if act 421 has been repeatedly performed for the upper limit on the number of iterations.

If the answer in act 421 is no, computer 200 goes to act 422 and invokes the coverage analyzer 220 to identify one or more unmet goals. Then computer 200 goes to act 423. In act 423, computer 200 compresses the unmet goals (also called "holes") into a compact form, as illustrated in FIG. 1C. Next, the compressed goals are prioritized (e.g. sorted in the order of priority). Depending on the embodiment, any prioritization scheme may be used, although in some embodiments the compressed goals are prioritized by a measure of the amount of compression. For example, if N goals have been compressed to form a compressed goal then that compressed goal's priority is set to N. In some embodiments, the priority is alternatively or additionally based on the coverage metric for each goal. Accordingly, a goal whose coverage metric is low is prioritized higher than another goal whose coverage metric is high.

Moreover, in certain embodiments, the priority is alternatively or additionally based on each goal priority in the previous iteration. Accordingly, a goal whose priority was high in the previous iteration is de-prioritized in the current iteration by a predetermined value (of priority). The decrement of priority allows another goal in a future iteration to eventually become the highest priority goal. In one illustrative embodiment, the decrement is one-third of a difference between the priority of the highest priority goal P and the next highest priority goal Q, so that goal P is used in three iterations after which goal Q becomes the highest priority goal.

Accordingly, in some embodiments computer 200 identifies a highest priority goal P, and uses the identified goal P to select one or more coverage-based constraint(s). In several embodiments, computer 200 makes its selection from among the coverage-based constraints that were already generated in acts 413 and/or 417 as described above. In other embodiments, computer 200 may identify a predetermined number of goals, based on one or more predetermined criteria, and use the identified goal(s) to select coverage-based constraint(s).

Thereafter, computer 200 repeats act 418, i.e. invokes the constraint solver 217, but during each repeated performance the coverage-based constraints are used in addition to the manually-specified constraints. Computer 200 thereafter goes to act 419 (described above) which uses the test vectors from act 418, although during repeated performance the test vectors are generated by use of coverage-based constraints in combination with manually-specified constraints.

In some embodiments, each goal includes a target of the number of times the goal is to be met. In such embodiments, the target for user-specified goals is not limited but a corresponding target for goals that are automatically generated (e.g. from user-specified constraints) is limited to 1, i.e. a binary value whereby the goal can be either hit or not hit. For each user-specified goal, when a value for the corresponding signal has been attained in simulation, a count of the user-specified goal is incremented. A ratio of the count to the target provides an indication of coverage. For example, if the target is 15 for an output signal Y to have a value in the range [1,10], and if the count is 5, then the coverage metric is 33%. In some embodiments, such coverage metrics across a number of goals in a group are averaged and the average metric value is used to decide to break out of a loop.

A data structure that is used by coverage maximizer 201 is illustrated below in Appendix A. Moreover, certain operations that are performed by coverage maximizer 201 are illustrated below in Appendix B. Also, Appendix C illustrates a method performed by a coverage maximizer of the type described herein to automatically generate one or more constraints from coverage goals, for use by a constraint solver in generating test vectors. In this context, a cover point as defined by computer 200 represents a signal or variable in the device being verified, whose values are of interest and need to be monitored. If the user has specified the following in a constraint specification: rand bit [7:0] x; rand PktType p; PktType prevp. In this example, a cover point may be specified for signal x and for signals inside the composite object p. The cover point expression is just the signal itself. For the cover point x, computer 200 is programmed to create bins (each bin including a counter associated with one or more values of the signal) such that the total range of values possible for signal x is equally distributed in 64 bins. If a cover point is for an enum type variable or signal, then computer 200 is programmed to create one bin (including a counter) for every enum type value that the signal can take. For signals with precision greater than 8 bits, computer 200 is programmed to perform exponentially distributed volume auto binning with a maximum of 64 bins.

For membership of a signal (also called variable) in a set with constant members, a single cover point is created, and the sample expression will be the same as the LHS value in the set membership constraint. Specifically, a first bin is created for the low value of each range, a second bin is created for the high value of each range, for non-singleton ranges and a third bin is created for a subrange which excludes the low and high values of each range, if the resulting subrange is non-empty. For example, if the coverage specification contains the statement x in $\{0:5, 7\}$; then a cover point with expression x and four bins, 0, 1-4, 5, 7 is created.

Similarly for membership in sets with non-constant members, three cover points are created for each of the ranges as follows: (1) a cover point with the expression (LHS_expression==range_low_expression), (2) a cover point with the expression (LHS_expression==range_high_expression), and (3) a cover point with the expression ((LHS_expression>range_low_expression) && (LHS_expression<range_high_expression)). For example, if the coverage specification is x in $\{a:5, b\}$; then cover points with expressions as follows are created: x==a, (x>a && x<5), x==5, x==b.

While certain embodiments of coverage maximizer 201 includes two portions 201S and 201C to formulate constraints, by use of goals on input signals and also by use of goals on non-input signals, other embodiments will be apparent to the skilled artisan in view of this disclosure. Other such embodiments of a coverage maximizer may process only goals on input signals to formulate directly-derived constraints, and in these embodiments goals on non-input signals are not used to formulate constraints and hence correlations are not used. Still other such embodiments do the opposite, e.g. the coverage maximizer processes only goals on non-input signals in the above-described manner to formulate correlation-derived constraints, and in these embodiments goals on input signals are not used to formulate any constraints.

Figure 5B:
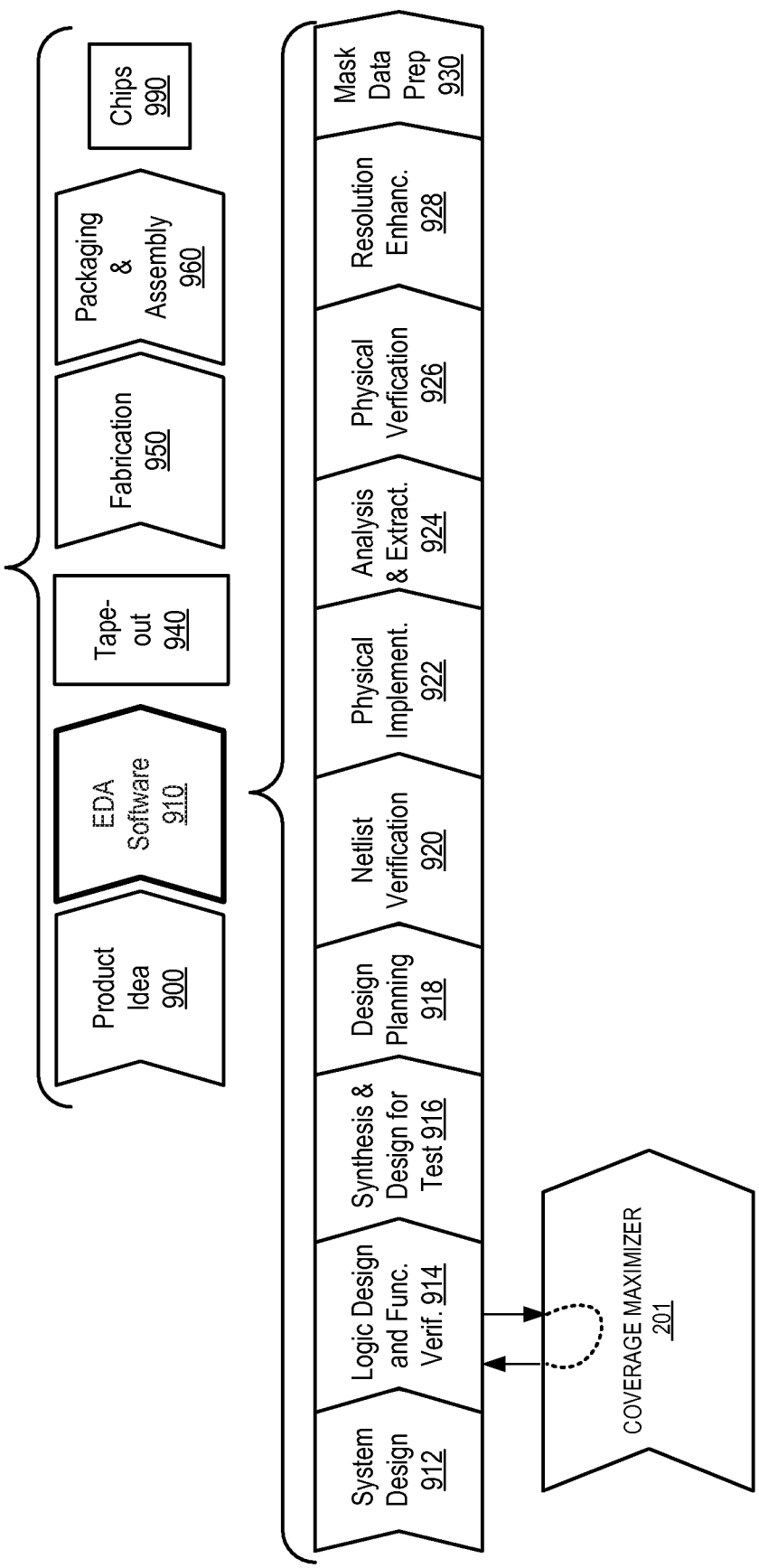
FIG. 5B illustrates, a simplified representation of an exemplary digital ASIC design flow in accordance with the invention.

Any coverage maximizer of the type described above may be used in a digital ASIC design flow, which is illustrated in FIG. 5B in a simplified exemplary representation. At a high level, the process of designing a chip starts with the product idea (900) and is realized in a EDA software design process (910). When the design is finalized, it can be taped-out (event 940). After tape out, the fabrication process (950) and packaging and assembly processes (960) occur resulting, ultimately, in finished chips (result 990).

The EDA software design process (910) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products. A coverage maximizer 201 (FIG. 2) is used in this stage in some embodiments of the invention. If the displayed results are not satisfactory, a chip designer may go back to stage 912, to make changes to their IC design.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Flooplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 922): The placement (positioning of circuit elements) and routing (connection of the same) occurs at this step. Exemplary EDA software products from Synopsys, Inc. that can be used at this stage include the Astro product. Although circuitry and portions thereof (such as rectangles) may be thought of at this stage as if they exist in the real world, it is to be understood that at this stage only a layout exists in a computer 200. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for:

manufacturing, electrical issues, lithographic issues, and circuitry. Exemplary EDA software products from Synopsys, Inc. that can be used at this stage include the Hercules product.

Resolution enhancement (stage 928): This involves geometric manipulations of the layout to improve manufacturability of the design. Exemplary EDA software products from Synopsys, Inc. that can be used at this include iN-Phase, Proteus, and AFGen products.

Mask data preparation (stage 930): This provides the "tapeout" data for production of masks for lithographic use to produce finished chips. Exemplary EDA software products from Synopsys, Inc. that can be used at this include the CATS(R) family of products. Actual circuitry in the real world is created after this stage, in a wafer fabrication facility (also called "fab").

The data structures and software code for implementing one or more acts described in this detailed description can be encoded into a computer-readable storage medium, which may be any storage medium that can hold code and/or data for use by a computer. Storage medium includes, but is not limited to, magnetic and optical storage devices such as disk drives, magnetic tape, CDs (compact discs), and DVDs (digital versatile discs).

Note that a computer system used in some embodiments to implement a coverage maximizer of the type described herein uses one or more linux operating system workstations (based on IBM-compatible PCs) or unix operating systems workstations (e.g. SUN Ultrasparc, HP PA-RISC, or equivalent), each containing a 2 GHz CPU and 1 GB memory, that are interconnected via a local area network (Ethernet).

Also note that in some embodiments, computer 200 stores not only coverage-based constraints 401 in its memory that is internal to test bench 400, but also stores one or more notations in such internal memory for use by a coverage maximizer and/or constraint analyzer as follows. For every coverage goal (on input signals) using which computer 200 automatically creates constraints, it makes a notation in the internal memory, of the association therebetween. In such embodiments, every constraint generated by computer 200 to target coverage goals (also called internal constraint) is assigned a unique integer identifier by the compiler. The only requirement followed by computer 200 of some embodiments is for this identifier (also called "constraint identifier") to be unique for each internally generated constraint.

A constraint solver in computer 200 reads the information about the constraints as well as the constraint identifier of each constraint and stores the information in its internal memory as a mapping between constraint identifiers and actual constraints. In such embodiments, every coverage goal is read by the compiler and is converted into a binary form that is understandable by the coverage analyzer and/or the coverage maximizer. In addition to other information about each coverage goal (such as the name and values etc.), the compiler also writes into the memory of computer 200, the constraint identifiers that uniquely identify the constraints, which if enabled, will cause the coverage goal to be met.

The coverage maximizer uses the information written out by the compiler for both the internal constraints and the coverage goals in order to attain the unmet coverage goals. After the unmet coverage goals have been prioritized and the highest priority goal has been selected, the coverage maximizer identifies the one or more constraint identifier(s) for that coverage goal. These coverage identifier(s) are stored as part of the data structure representing a coverage goal. Once the constraint identifiers are known, then the coverage maximizer instructs the constraints solver to enable the constraints identified by the constraint identifier. The constraint identifier prepares a mapping between the constraint identifier and the actual constraint and enables the selected constraint when generating the next set of stimulus vectors. When the coverage goal represents a sequence of values, then a sequence of stimulus vectors have to be generated so as to match the sequence of values specified in the coverage goal, in order to meet the coverage goal. This is accomplished by the constraints solver by enabling one constraint at a time, where each constraint at a particular time is obtained from the corresponding value in the sequence being matched.

In an illustrative, example, for an automatically binned cover point (cp1) goal, the constraint generated is a set membership constraint as follows:

constraint cons_cp1 {cp1 in {cp1_lvar:cp1_hvar};}.

A unique identifier (say id=2345) is assigned by the compiler to the above constraint and the constraint identifier is written to memory by the compiler in a binary form that the constraints solver can read and understand (e.g. the same data structure is used by both the compiler and the constraint solver to exchange all such information therebetween). In addition for the coverage goal represented by the cover point cp1, the same identifier (2345) is also written out by the compiler as part of the coverage information in a form that can be understood by the coverage engine. When the coverage goal represented by cp1 is identified as being unmet and is prioritized as the highest priority hole, the coverage maximizer obtains its constraint identifier (2345) and passes it to the constraint solver which in turn maps the constraint identifier to its corresponding constraint defined above and enables that constraint when generating the next set of stimulus vectors. As another illustrative example, for the coverage goal representing a signal having a sequence of values, say 5 followed by 6 followed by 7, 3 constraints will be generated as set membership constraints as follows:

cons_cp1_1 {cp1 in {5};}
cons_cp1_1 {cp1 in {6};}
cons_cp1_1 {cp1 in {7};}

Unique identifiers are assigned to each of the above constraints (say 10, 11 and 12). When this coverage goal is identified as unmet and prioritized as the highest priority goal, the coverage maximizer obtains the set of constraint identifiers and supplies then in the correct order to the constraints solver. Thus it first passes the constraint id 10 to the constraint solver for generating the next set of stimulus vectors. Next it passes constraint id 11 to the constraint solver to generate the second set of stimulus vectors, and finally it passes constraint id 12 to the constraint solver to generate the third set of stimulus vectors. In this manner the coverage maximizer attempts to achieve the coverage goal represented by the sequence of values.

Numerous modifications and adaptations of the embodiments described herein will become apparent to the skilled artisan in view of this disclosure.

APPENDIX A

```
1
2    group ->
3        goal list (goals can be of types cover point and cross)
4    goal ->
5        integer target count (also known as at_least count)
6        integer weight
7        type of goal (cover point or cross)
8        cover point goal ->
9            cover point expression
10           cover point bin list
```

APPENDIX A-continued

```
11      cross goal ->
12         cover point goal list
13         cross bin list
14      cover point bin ->
15         current count
16         list of (low, high) pairs, representing range
17      cross bin ->
18         current count
19         set of cover point bin combinations grouped in cross bin
```

APPENDIX B

```
 1
 2   IncrementCoverage
 3   Sample signals
 4    for each cover point goal
 5       compute cover point expression
 6       foreach cover point bin
 7          if cover point expression is in the lo:high range for bin, increment count for
 8   bin
 9   for each cross goal
10      foreach cross bin
11         if any contained combination of cover point bins has received a hit,
12   increment count for bin
13
14   Compute Score (score history used to compute slope for flattening)
15    Score = 0.0
16   TotalScore = 0.0
17    for each cover point goal
18       Score = Number of cover point bins with bin count >= target count / Total
19   number of cover point bins
20       TotalScore += Score
21   for each cross goal
22       Score = Number of cross bins with bin cound >= target count / Total number
23   of cross bins
24       TotalScore += Score
25    TotalScore /= (Number of cover point goals + Number of cross goals);
26   return TotalScore
27
28   Compute highest weighted compressed bin (compressed priority hole)
29   best weight = 0
30   priority bin = null
31
32   // compute weights
33   for each cover point goal
34      foreach cover point bin
35         weight = weight formula
36   // find adjacent bins and compress
37   copy all cover group data into copy group
38   done = false
39   while not done
40      done = true
41      foreach cover point bin (bin1)
42         foreach cover point bin (bin2)
43            if bin1 and bin2 are adjacent
44               combine bin2 into bin1
45               add weight of bin2 to weight of bin1 and store in weight of bin1
46               done = false
47   for each cover point goal in copy group     // compute best cover point bin
48      foreach cover point bin
49         if (weight > best weight)
50            best weight = weight
51            priority bin = current bin
52   for each cross goal // compute best cross
53      foreach cross bin
54         weight = weight formula
55         if (weight > best weight)
56            best weight = weight
57            priority bin = current bin
58   return priority bin
59
60   NOTE - the weight formula which is used is not critical to the invention, and the
61   weight formula is different depending on the embodiment
```

APPENDIX C

```
1
2    For every cover point in the coverage spec
3        If the cover point expression is not composed of random variables then
4        ignore it and go to the next cover point
5        If the cover point has a guard expression and the guard expression is
6        composed of random expressions then create a constraint with constraint
7        expression being the same as the guard expression
8        if the cover point is auto binned
9            Create a set membership constraint with cover point expression on
10           left hand side (LHS) and a variable range on right hand side
11           (RHS).
12           The variables used in the range expression are tool generated are of
13           the same type as cover point expression.
14           The values for the variables will be assigned based on the active
15           prioritized coverage hole
16       if the cover point has user defined bins
17           For every user defined bin
18               If the bin has a guard include the guard expression as a
19               constraint expression guard for any constraint created in the
20               following steps
21               if the user defined bin is of type NORMAL VALUE then
22                   Create a set membership constraint with cover point
23                   expression on LHS and the ranges of the bin on
24                   RHS.
25                   If the ranges are not constant then a variable range
26                   should be used on the RHS.
27                   The values of the variables will be assigned at
28                   runtime based on the values at the time of
29                   initialization
30               if the user defined bin is of type ARRAY VALUE then
31                   Create a set membership constraint with cover point
32                   expression on left hand side (LHS) and a variable
33                   range on right hand side (RHS).
34                   The variables used in the range expression are tool
35                   generated are of the same type as cover point
36                   expression.
37                   The values of the variables will be assigned at
38                   runtime based on the values at the time of
39                   initialization and the currently prioritized hole
40               if the user defined bin is of type NORMAL TRANSITION then
41                   Create a set membership constraint for every
42                   member in the sequence specified in the transition.
43                   The LHS for the set membership constraints should
44                   be the cover point expression.
45                   The RHS for the set membership constraints should
46                   be the value for the corresponding position in the
47                   sequence.
48                   If the value is a compile time constant, then the
49                   constant value should be used as is.
50                   If the value is not a compile time constant, then a
51                   variable range should be used just as is done for the
52                   constraints generated for array value bin
53               if the user defined bin is of type ARRAY TRANSITION then
54                   Create a set membership constraint for every
55                   member in the sequence specified in the transition.
56                   The LHS for the set membership constraints should
57                   be the cover point expression.
58                   The RHS for the set membership constraints should
59                   be a variable range as is done for the array value
60                   case.
61               if the user defined bin is of type ILLEGAL VALUE or
62               ILLEGAL ARRAY VALUE then
63                   Create a "not in" type of set membership constraint
64                   with LHS and RHS similar to what is done for the
65                   normal value case.
66               if the user defined bin is of type ILLEGAL TRANSITION
67               or ILLEGAL ARRAY TRANSITION then
68                   Follow the procedure similar to the normal
69                   transition case except that a "not in" type of set
70                   membership constraint should be created
71   For every cross in the coverage spec
72       If the cross has a guard expression and the guard expression is composed
73       of random variables, then create a constraint with the constraint expression
74       being the same as the guard expression
75       For every user defined non-illegal and non-ignored bin in the cross
76           If the bin has a guard expression and the guard expression is
77           composed of random variables, then create a constraint with the
78           constraint expression being the same as the guard expression
```

What is claimed is:

1. A computer-implemented method to prepare test vectors for functional verification of a design of a circuit, the method comprising:
   receiving a plurality of goals for coverage of a plurality of signals of the circuit;
   wherein each goal identifies a signal, at least one value for said signal, and a number of times said signal is to have said at least one value;
   automatically creating a first constraint on at least one signal of the circuit, by use of at least one goal in the plurality of goals;
   receiving a second constraint;
   using a constraint solver to automatically generate a test vector comprising a value of said at least one signal, by use of each of said first constraint and said second constraint in combination; and
   storing the test vector in a computer memory.

2. The method of claim 1 wherein each goal identifies a non-input signal and at least one value for said non-input signal, the method further comprising, prior to said automatically creating:
   receiving a plurality of correlations, each correlation identifying a non-input signal with at least one input signal of the circuit;
   wherein said automatically creating comprises using at least one correlation in the plurality of correlations with at least one goal in the plurality of goals.

3. The method of claim 1 further comprising:
   supplying the test vector to a simulator; and
   receiving from a coverage analyzer coupled to the simulator, identification of a set of unmet goals from among the plurality of goals.

4. The method of claim 3 further comprising:
   automatically creating a group of first constraints in addition to said first constraint;
   compressing into a compound goal, a subset of unmet goals in the set of unmet goals;
   wherein each unmet goal in said subset of unmet goals is on a cross of a pair of signals in the plurality of signals;
   assigning a size to the compound goal, based on a count of unmet goals in said group of unmet goals compressed into the compound goal; and
   prioritizing among several unmet goals including said compound goal, based at least on size;
   selecting another constraint from among a plurality of first constraints comprising said first constraint and said group of first constraints, by use of a highest priority goal identified by the prioritizing;
   using the constraint solver to automatically generate another test vector by use of each of said second constraint and said another constraint obtained from said selecting; and
   storing said another test vector in said computer memory.

5. The method of claim 3 further comprising:
   automatically creating a group of first constraints in addition to said first constraint;
   selecting another constraint from among a plurality of first constraints comprising said first constraint and said group of first constraints, based on at least one unmet goal in said set;
   using the constraint solver to automatically generate another test vector by use of each of said another constraint and said second constraint; and
   storing said another test vector in said computer memory.

6. The method of claim 3 further comprising:
   receiving from said coverage analyzer a coverage score related to said at least one goal;
   repeatedly performing said automatically creating, and said using and said supplying until a predetermined condition on said coverage score is met.

7. The method of claim 6 wherein:
   said predetermined condition is on a rate of change of said coverage score as a function of a count of said repeatedly performing.

8. The method of claim 1 wherein:
   said at least one goal is on a sequence of values;
   said value is a first value in said sequence;
   the method further comprises using the constraint solver to automatically generate another test vector by use of at least a second constraint;
   wherein said second constraint is on a second value in said sequence; and
   wherein said second value follows said first value in a time order specified by said sequence.

9. The method of claim 1 wherein:
   the second constraint is received from a human.

10. An article of manufacture comprising a computer-readable storage medium encoded with:
    a plurality of first goals for coverage of a plurality of first signals input to a circuit;
    a plurality of second goals for coverage of a plurality of second signals of the circuit;
    wherein each second signal is at least one of internal to the circuit and output by the circuit;
    a plurality of correlations, each correlation relating at least one second signal in the plurality of second signals to at least one first signal in the plurality of first signals;
    a plurality of constraints on the plurality of first signals;
    a test vector comprising values for the plurality of first signals; and
    a plurality of computer instructions to use at least one correlation and at least one second goal to generate and store in computer memory, an additional constraint on a first signal input to said circuit.

11. The article of manufacture of claim 10 further comprising:
    a plurality of additional constraints identified as being received from a human.

12. The article of manufacture of claim 10 further comprising:
    a plurality of additional instructions to receive a test result from use of the test vector by a simulator and use said test result in identifying an un-met goal and supply identification of said un-met goal to said plurality of computer instructions.

13. The article of manufacture of claim 10 further comprising:
    a plurality of additional instructions to use said additional constraint to generate and store in said computer memory, an additional test vector.

14. The article of manufacture of claim 13 wherein:
    based on whether a predetermined condition on a coverage score is met, said plurality of computer instructions identify another constraint for use by said plurality of additional instructions.

15. A computer-implemented apparatus for preparing test vectors for functional verification of a design of a circuit, the apparatus comprising:
    a memory encoded with a plurality of first goals for coverage of a plurality of first signals input to the circuit, a plurality of second goals for coverage of a plurality of second signals of the circuit, wherein each second signal is at least one of internal to the circuit and output by the circuit, and a plurality of correlations, each correlation relating at least one second signal in the plurality of second signals to at least one first signal in the plurality of first signals;

first means, coupled to said memory, for preparing a constraint based at least partially on a correlation in said plurality of correlations;

second means, coupled to said memory, for operating a predetermined method to generate a test vector based at least partially on said constraint; and third means, coupled to said first means and said second means, for operating a simulator on the circuit based at least partially on said test vector.

16. The apparatus of claim 15 wherein:
the memory is further encoded with a loop count; and
the third means is coupled to the memory to receive the loop count.

17. A computer-implemented method to prepare test vectors for functional verification of a design of a circuit, the method comprising:

preparing a constraint on a signal input to the circuit based at least partially on a correlation in a plurality of correlations in a computer memory;

operating a constraint solver to generate a test vector based at least partially on said constraint; and operating a simulator to simulate signals in the circuit based at least partially on said test vector, and storing a result from said simulator in said computer memory;

wherein each correlation in said plurality of correlations relates at least one second signal in a plurality of second signals in said simulator to at least one first signal in a plurality of first signals in said simulator; and wherein during simulation, the simulator inputs to a simulation of said circuit at least said plurality of first signals including said signal; and wherein each second signal in the plurality of second signals is at least one of internal to the circuit and output by the circuit.

18. The method of claim 17 further comprising:

receiving from a coverage analyzer coupled to the simulator, identification of at least one unmet goal from among a plurality of goals for coverage of said plurality of second signals; and creating an additional constraint on said signal input to the circuit, by use of at least said one unmet goal, and storing the additional constraint in said computer memory;

wherein said constraint solver is operated during said operating, based on said additional constraint.

19. The method of claim 18 further comprising:

receiving from said coverage analyzer a coverage score related to said one unmet goal; and repeatedly performing said creating, and said operatings until a predetermined condition on said coverage score is met.

* * * * *